(12) United States Patent
Zeng

(10) Patent No.: US 12,027,619 B2
(45) Date of Patent: Jul. 2, 2024

(54) SEMI-SGT MOSFET DEVICE AND METHOD FOR MAKING THE SAME

(71) Applicant: Shenzhen Sanrise-Tech Co., LTD, Guangdong (CN)

(72) Inventor: Dajie Zeng, Guangdong (CN)

(73) Assignee: Shenzhen Sanrise-Tech Co., LTD, Guangdong (CN)

( * ) Notice: Subject to any disclaimer, the term of this patent is extended or adjusted under 35 U.S.C. 154(b) by 408 days.

(21) Appl. No.: 17/520,885

(22) Filed: Nov. 8, 2021

(65) Prior Publication Data
US 2022/0209004 A1 Jun. 30, 2022

(30) Foreign Application Priority Data
Dec. 31, 2020 (CN) .......................... 202011635490.4

(51) Int. Cl.
*H01L 29/78* (2006.01)
*H01L 29/66* (2006.01)

(52) U.S. Cl.
CPC .... *H01L 29/7813* (2013.01); *H01L 29/66734* (2013.01); *H01L 29/7811* (2013.01)

(58) Field of Classification Search
CPC ........... H01L 29/7813; H01L 29/66734; H01L 29/7811; H01L 29/0878; H01L 29/41766; H01L 29/407; H01L 29/78; H01L 21/8234; H01L 27/088; H01L 29/0607; H01L 29/0684; H01L 29/36; H01L 29/4236; H01L 29/66477; H01L 29/66704; H01L 29/7397; H01L 29/7825
See application file for complete search history.

(56) References Cited

U.S. PATENT DOCUMENTS

2016/0013265 A1* 1/2016 Yilmaz ............... H01L 27/0823
257/192

* cited by examiner

*Primary Examiner* — Mohammad A Rahman
(74) *Attorney, Agent, or Firm* — Banner & Witcoff, Ltd.

(57) ABSTRACT

The present application discloses a semi-SGT MOSFET device, comprising: doped first and second epitaxial layers of a first conductivity type formed on a semiconductor substrate. The semi-SGT MOSFET device is divided into an active region and a terminal region. The first epitaxial layer is divided into a first region located in the active region and a second region located in the terminal region, and doping concentrations of the first region and the second region are configured individually. The doping concentration of the second epitaxial layer is higher than the doping concentration of the first region, and the doping concentration of the second region is lower than the doping concentration of the first region, so that the second region can be fully depleted when the device is reversely biased, thereby increasing the withstand voltage of the terminal region. The present application further discloses a method for manufacturing the semi-SGT MOSFET device.

17 Claims, 9 Drawing Sheets

SEMI-SGT MOSFET DEVICE AND METHOD FOR MAKING THE SAME

CROSS-REFERENCES TO RELATED APPLICATIONS

This application claims the priority to Chinese Patent Application No. 202011635490.4, filed on Dec. 31, 2020, the disclosure of which is incorporated herein by reference in its entirety.

TECHNICAL FIELD

The present application relates to the field of semiconductor integrated circuit manufacturing, in particular to a semi-shield gate trench (SGT) MOSFET device; the present application further relates to a method for manufacturing the semi-SGT MOSFET device.

BACKGROUND

Compared with the conventional trench MOSFET, in an SGT MOSFET, a longitudinal source field plate, i.e., source polysilicon, is inserted into a drift region. The source field plate laterally depletes the drift region, so as to greatly increase the doping concentration of the drift region without reducing the breakdown voltage, thereby reducing the specific on-resistance and achieving better performance. There are two very common existing SGT MOSFET structures, which are separately introduced as follows:

Referring to FIG. 1, which is a schematic diagram of a structure of a first existing SGT MOSFET device, the first existing SGT MOSFET device is an SGT MOSFET with a top-bottom structure. Taking an N-type device as an example, the first existing SGT MOSFET device has a gate structure formed in a gate trench 101.

The gate trench 101 is formed in an N-type first epitaxial layer 2. The first epitaxial layer 2 is formed on an N-type heavily doped semiconductor substrate 1. The semiconductor substrate 1 is usually a wafer structure.

Generally, the semiconductor substrate 1 is a heavily doped structure and serves as a drain region after backside thinning. In order to reduce reverse diffusion of the semiconductor substrate 1, the semiconductor substrate 1 is usually an arsenic-doped substrate. However, the lowest resistivity of a phosphorous-doped substrate available in the existing process is lower than that of the arsenic-doped substrate. Therefore, in a case of a relatively high proportion of substrate resistance, for example, in a low voltage device below 40 V, the phosphorus-doped substrate is also commonly used. When the semiconductor substrate 1 becomes thinner, the heat dissipation of the device becomes better, and the substrate resistance can be reduced more significantly.

The gate structure shown in FIG. 1 is a top-bottom gate structure, in which source polysilicon 4 is formed at the bottom of the gate trench 101, and the source polysilicon 4 and the gate trench 101 are isolated from each other by a shielding dielectric layer 3 provided therebetween. The shielding dielectric layer 3 needs to withstand the breakdown voltage of the device. Therefore, when the breakdown voltage required by the device becomes higher, the shielding dielectric layer 3 becomes thicker.

A polysilicon gate 6 is formed on the top of the gate trench 101, and the polysilicon gate 6 and the gate trench 101 are isolated from each other by a gate dielectric layer provided therebetween, such as a gate oxide layer 5. The polysilicon gate 6 and the source polysilicon 4 are isolated from each other by an inter-polysilicon oxide layer provided therebetween.

A P-type doped channel region 7 is formed in a surface region of the first epitaxial layer 2, and the junction depth of the channel region 7 is less than or equal to the depth of a first side surface of the polysilicon gate 6. The surface of the channel region 7 covered by the first side surface of the polysilicon gate 6 is used to form a channel.

The first epitaxial layer 2 below the channel region 7 forms a drift region. The biggest difference between the SGT MOSFET and the conventional trench MOSFET is that the longitudinal source polysilicon 4 is laterally inserted into the drift region.

An N-type heavily doped source region 8 is formed on the surface of the channel region 7.

The N-type heavily doped drain region is formed by the thinned semiconductor substrate 1 or by stacking the thinned semiconductor substrate 1 and an N-type heavily doped backside ion implantation region.

The first existing SGT MOSFET device further includes an interlayer film 11 and a contact (CT) 9 penetrating through the interlayer film 11. The bottom of the corresponding contact 9 on the top of the source region 8 penetrates through the source region 8 to achieve contact with both the source region 8 and the channel region 7. The source and gate are formed by patterning a front side metal layer 10, and the source is connected to both the source region 8 and the channel region 7 by means of the corresponding contact 9 at the bottom. The source polysilicon 4 is also connected to the source by means of the corresponding contact 9 at the top. The gate is connected to the polysilicon gate 6 by means of the corresponding contact at the bottom.

Referring to FIG. 2, which is a schematic diagram of a design structure of a second existing SGT MOSFET device, the second existing SGT MOSFET device is an SGT MOSFET device with a left-right structure. Compared with the first existing SGT MOSFET device shown in FIG. 1, the second existing SGT MOSFET device has the following features:

A polysilicon gate 6a has a left-right structure. Such the polysilicon gate 6a having a left-right structure is formed by etching back the shielding dielectric layer 3 after the formation of the source polysilicon 4 and the shielding dielectric layer 3 and then filling a region where the shielding dielectric layer 3 is removed with a gate dielectric layer 5a and the polysilicon gate 6a.

It can be seen that the biggest difference between the first and second existing SGT MOSFET devices lies in:

the relative position of the polysilicon gate and source polysilicon, wherein the polysilicon gate 6 in FIG. 1 is located directly above the source polysilicon 4, thus forming a top-bottom structure; and polysilicon gate 6a in FIG. 2 is located at the left and right sides of the source polysilicon 4, thus forming a left-right structure.

The advantages and disadvantages of the two structures are as follows:

The process for achieving the top-bottom structure is more complicated for the following reason: the source polysilicon 4 is covered by the polysilicon gate 6 directly above it, so that the source polysilicon 4 cannot be directly connected to the contact, thus requiring additional lithography plate and process steps.

The process for achieving the left-right structure is simple and does not require particularly complicated process steps. In both structures, for example, the polysilicon gate 6a and the source polysilicon are both on the surface of the wafer, i.e., the surface of the first epitaxial layer 2, and thus can be directly and easily connected. However, compared with the top-bottom structure, the left-right structure has a larger contact area between the polysilicon gate and the source polysilicon, which results in a larger input capacitance.

In order to provide higher output power, in addition to increasing the output current, which requires the on-resistance of the MOSFET to be as low as possible, it is also necessary to increase the output voltage by increasing the breakdown voltage of the MOSFET.

Compared with the trench MOSFET, the SGT MOSFET has a lower specific on-resistance, thus achieving a lower resistance. Therefore, the trench MOSFET is replaced by the SGT MOSFET in more and more occasions.

However, the SGT MOSFET has a problem, that is, if the breakdown voltage of the device becomes higher, it is required that:
1. The gate trench 101 becomes deeper, and the corresponding source field plate, i.e., the source polysilicon 4 becomes longer.
2. The shielding dielectric layer 3 becomes thicker; the shielding dielectric layer 3 is usually formed by an oxide layer.

Accordingly, a great difficulty is brought into the implementation of the process. Even if the process can be implemented, a stress problem may occur due to a mismatch between the thermal expansion coefficients of the oxide layer and silicon. The stress problem also causes the alignment accuracy to decrease, wherein the most important alignment accuracy is the alignment accuracy of the CT, thereby increasing the threshold fluctuation.

In order to reduce the device costs, power devices are currently being switched from 8 inches to 12 inches, so as to reduce the device production costs. The stress problem in devices of 12 inches is more serious than that in devices of 8 inches. 8 inches and 12 inches refer to the diameter of wafer, wherein the device is formed on the wafer.

And more importantly, in the current SGT MOSFET, the voltage of the source field plate is at a fixed level of 0 V, and the voltage of the drift region gradually increases from a voltage approximating the source voltage to the drain voltage. Thus, a voltage difference between the source field plate and the drift region gradually increases, and accordingly, the depletion capability with respect to the drift region gradually weakens, leading to nonuniform distribution of the electric field intensity in the body. Therefore, the relationship between the depth of the trench and the breakdown voltage is nonlinear, and the high-voltage device thus requires a larger depth of the gate trench 101, thereby further exacerbating the stress problem.

Therefore, the current SGT MOSFET with a breakdown voltage above 150 V usually adopts a semi-SGT. The semi-SGT can be regarded as an SGT+Trench MOSFET. Referring to FIG. 3, which is a schematic diagram of a device cell structure of an existing semi-SGT MOSFET device, FIG. 3 illustrates an implementation mode of a typical 250 V SGT, i.e., a semi-SGT implementation mode. The difference between the existing semi-SGT MOSFET shown in FIG. 3 and the existing SGT MOSFET shown in FIG. 2 lies in that the 250 V breakdown voltage in FIG. 3 is applied to two portions:
1. An epitaxial layer 2a, the doping concentration of which is relatively low, is used to realize a withstand voltage of 100 V. The principle thereof is similar to that of the existing ordinary trench MOSFET, such as a VDMOS, that is, the withstand voltage of the epitaxial layer 2a is realized by longitudinally depleting the epitaxial layer 2a by means of the drain voltage. A typical condition for realizing the 100 V withstand voltage is that the thickness of the drift region corresponding to the epitaxial layer 2a is 8-10 μm and the corresponding resistivity is 2.0-3.5 Ω*cm.
2. An epitaxial layer 2b, the doping concentration of which is relatively high, is used to realize an 150 V SGT MOSFET, that is, the epitaxial layer 2b is mainly laterally depleted by the source polysilicon 4, Since the doping concentration of the epitaxial layer 2b is relatively high, the longitudinal depletion performed by the drain voltage accounts for a relatively small or negligible proportion. A typical condition is that the thickness of the drift region is 7-11 μm and the corresponding resistivity is 0.3-0.6 Ω*cm.

A shielding dielectric layer 33 is usually made of silicon dioxide, and the corresponding thickness thereof is 0.8-1.2 μm. In the case described herein, the doping concentration of the drift region is uniform. It can be seen from the voltage difference problem introduced above that, the voltage difference between the source polysilicon 3 and the drift region gradually increase as the longitudinal depth increases. In order to make the distribution of the electric field intensity of the SGT in the body closer to the ideal, a drift region with two or more doping concentrations or gradually varying doping can be used to change the doping concentration of the epitaxial layer 2b.

It should be noted that in the structure shown in FIG. 3, in order to realize a better withstand voltage, the gate trench 101 needs to penetrate through the epitaxial layer 2b to reach the epitaxial layer 2a. Otherwise, the withstand voltage of the VDMOS cannot satisfy the expectation.

There is a huge difference in the distribution of the electric field intensity in the body during breakdown of the semi-SGT and full SGT.

FIG. 4A illustrates the distribution of the electric field intensity in the body region when the device cell structure of the second existing SGT MOSFET device with a breakdown voltage of 150 V corresponding to FIG. 2. FIG. 4A illustrates the simulation of a half of a primitive cell, i.e., a half of the device cell structure. FIG. 4B illustrates the distribution of the electric field intensity in the body region when the device cell structure of the existing semi-SGT MOSFET device with a breakdown voltage of 250 V corresponding to FIG. 3. Comparing FIG. 4A and FIG. 4B, it can be seen that:

A simulation diagram of a portion above the bottom surface of the gate trench 101 in FIG. 4B is the same as that in FIG. 4A, that is, the upper portion of a simulation diagram of the electric field intensity of the 250 V SGT is the same as that of the 150 V SGT.

The only difference between FIG. 4B and FIG. 4A is that the epitaxial layer 2a is added to the 250 V SGT. The epitaxial layer 2a is a relatively lightly doped region, and the epitaxial layer 2a is depleted so as to withstand a voltage. Therefore, the electric field intensity distributions in FIG. 4B and FIG. 4A differs from each other significantly.

In the 150 V SGT structure, the edge of a depletion region corresponding to the mark 102 substantially ends at the bottom of the gate trench 101 and does not extend. This is because the doping concentration of the first epitaxial layer 2 in FIG. 2 is relatively high, and without the lateral depletion performed by the source polysilicon 4, the first epitaxial layer 2 at the bottom of the gate trench 101 cannot be depleted just by means of the vertical depletion performed by the drain voltage.

In the 250 V SGT structure, a depletion region corresponding to the mark 103 extends downward for a large amount from the bottom of the gate trench 101. The extension is the reason for the increase in the breakdown voltage (BV).

For the conventional SGT structure such as the second existing SGT MOSFET device shown in FIG. 2, because the depletion region is cut off at the bottom of the gate trench 101, without downward broadening, a simple terminal structure can be used. FIG. 5 is a schematic diagram of structures of an active region and a terminal region of the second existing SGT MOSFET device. FIG. 5 illustrates the active region 102 and the terminal region 103 located at the outer edge of the active region 102. The active region 102 includes a plurality of device cell structures. One device cell is illustrated in FIG. 5 and is boxed using a dashed line box 104. The device cell structure in the dashed line box 104 is the same as that in FIG. 2. A gate trench 101*a* is provided in the terminal region 103, a shielding dielectric layer 3*a* and source polysilicon 4*a* are provided in the gate trench 101*a*, and a polysilicon gate 6*a* is provided at a side of the source polysilicon 4*a* close to the active region 102. In FIG. 5, the depletion region of the terminal region 103 is also cut off at the bottom of the gate trench 101, so that the size of the depletion region of the active region 101 is similar to that of the terminal region 102. Therefore, the simple terminal structure in the terminal region 103 shown in FIG. 5 can satisfy the requirements.

If the structure of the terminal region 103 shown in FIG. 5 is also applied to the semi-SGT MOSFET shown in FIG. 3, that is, the epitaxial layer 2 in FIG. 5 is replaced with a stacking structure of the epitaxial layers 2*a* and 2*b* in FIG. 3, the epitaxial layer 2*a* needs to be depleted. However, in the terminal structure shown in FIG. 5, there is no other gate trench 101*a* at the right side, i.e., the outer side, of the gate trench 101*a* of the terminal structure. That is, the gate trench 101*a* in the terminal region 103 cannot be arranged alternately with a mesa region like the gate trench 101 arranged alternately with a mesa region between the gate trenches 101 in the active region 102. Therefore, the broadening of the depletion region performed by the source polysilicon 4*a* in the gate trench 101*a* of the terminal structure is limited, and the electric field intensity is increased. Referring to FIG. 5, the electric field intensity in the bottom region of the gate trench 101*a* corresponding to the circle 105 is increased, and the first epitaxial layer 2 at the bottom of the circle 105 does not expand, finally reducing the breakdown voltage of the device.

The simulation result indicates that if the semi-SGT shown in FIG. 3 adopts the terminal structure shown in FIG. 5, the BV may be reduced by 30 V.

Therefore, the semi-SGT structure requires a more complex terminal structure, and the BV of the terminal may be lower than that of the device cell region.

BRIEF SUMMARY

The technical problem to be solved by the present application is to provide a semi-SGT MOSFET device, so as to improve the breakdown voltage of a terminal region without affecting the performance of a device cell in an active region. To this end, the present application further provides a method for manufacturing the semi-SGT MOSFET device.

In order to solve the above technical problem, the semi-SGT MOSFET device provided by the present application comprises:

a doped first epitaxial layer of a first conductivity type formed on a semiconductor substrate, and a doped second epitaxial layer of the first conductivity type formed on the surface of the first epitaxial layer.

The semi-SGT MOSFET device is divided into an active region and a terminal region.

A plurality of device cells of the semi-SGT MOSFET device are formed in the active region, the device cell comprises a gate structure, the gate structure is formed in a gate trench, and a source conductive material layer is formed in the gate trench; the gate trench penetrates through the second epitaxial layer.

In the active region, each gate trench and a mesa region between the gate trenches form an alternate arrangement structure.

A terminal structure is provided in the terminal region, the terminal structure comprises one or more terminal gate trenches, the terminal gate trench penetrates through the second epitaxial layer, and a terminal source conductive material layer is formed in the terminal gate trench.

The first epitaxial layer is divided into a first region located in the active region and a second region located in the terminal region, and doping concentrations of the first region and the second region are configured individually.

The doping concentration of the second epitaxial layer is higher than the doping concentration of the first region, and the doping concentration of the second region is lower than the doping concentration of the first region, so that the second region can be fully depleted when the device is reversely biased, thereby increasing the withstand voltage of the terminal region.

In a further improvement, in the active region, when the device is reversely biased, each source conductive material layer has a lateral depletion effect on the second epitaxial layer in the mesa region, the terminal source conductive material layer has a lateral depletion effect on the second epitaxial layer in the terminal region, the lateral depletion effect of the terminal source conductive material layer on the second epitaxial layer in the terminal region is weaker than the lateral depletion effect of each source conductive material layer on the second epitaxial layer in the mesa region, and a reduction in the doping concentration of the second region compensates for the weakening of the lateral depletion effect of the terminal source conductive material layer on the second epitaxial layer in the terminal region.

In a further improvement, in the active region, when the device is reversely biased, the second epitaxial layer has a first withstand voltage, the first epitaxial layer has a second withstand voltage due to longitudinal depletion, and the withstand voltage of the semi-SGT MOSFET device in the active region is the sum of the first withstand voltage and the second withstand voltage;

the second epitaxial layer in the terminal region has a third withstand voltage, the second region has a fourth withstand voltage due to longitudinal depletion, and the withstand voltage of the semi-SGT MOSFET device in the terminal region is the sum of the third withstand voltage and the fourth withstand voltage; and the doping concentration of the second region is reduced to increase the fourth withstand voltage, so that the withstand voltage of the semi-SGT MOSFET device in the terminal region is greater than or equal to the withstand voltage in the active region.

In a further improvement, in the active region, the gate structure further comprises:

a gate conductive material layer, the gate conductive material layer spaced from a corresponding side surface of the gate trench by a gate dielectric layer.

The source conductive material layer is spaced from a corresponding inner side surface of the gate trench by a shielding dielectric layer.

The gate conductive material layer is isolated from the source conductive material layer by a conductive material interlayer dielectric layer.

The gate structure is a top-bottom structure, and the gate conductive material layer is located directly above the source conductive material layer.

Alternatively, the gate structure is a left-right structure, and the gate conductive material layer is located on both sides of a top region of the source conductive material layer.

In a further improvement, in the terminal region, a terminal gate conductive material layer is formed in the terminal gate trench or no terminal gate conductive material layer is formed.

In a further improvement, in the active region, each device cell further comprises:

a channel region formed by a doped well region of a second conductivity type.

A heavily doped source region of the first conductivity type is formed on the surface of the channel region.

A drift region is formed by the second epitaxial layer and the first epitaxial layer at the bottom of the channel region.

A heavily doped drain region of the second conductivity type is formed on the backside of the semiconductor substrate.

The source region is connected to a source formed by a front side metal layer by means of a via on the top.

The source conductive material layer is also connected to the source by means of the corresponding via on the top.

The gate conductive material layer is connected to a gate formed by the front side metal layer by means of the corresponding via on the top.

A backside metal layer is formed on the backside of the drain region, and a drain is formed by the backside metal layer.

In a further improvement, in the active region, the gate conductive material layer penetrates through the channel region and covers a side surface of the channel region.

The source conductive material layer covers a side surface of the second epitaxial layer at the bottom of the channel region; when the gate trench becomes deeper, the longitudinal length of the side surface of the second epitaxial layer covered by the source conductive material layer becomes longer, and the first withstand voltage becomes higher; when the shielding dielectric layer becomes thicker, the first withstand voltage becomes higher; when the gate trench becomes deeper and the shielding dielectric layer becomes thicker, the stress of the semiconductor substrate becomes larger; and the first withstand voltage is less than or equal to a maximum value defined by the stress of the semiconductor substrate.

In a further improvement, the terminal region further comprises:

the well region that forms the channel region in the active region.

No source region is formed on the surface of the well region.

The terminal region shares both the drift region and the drain region with the active region.

The terminal source conductive material layer is also connected to the source by means of the corresponding via on the top.

In a further improvement, a maximum value of the first withstand voltage is less than or equal to 150 V.

The thickness of the second epitaxial layer at the bottom of the channel region is 7-11 μm.

The resistivity of the second epitaxial layer is 0.3-0.6 $\Omega$*cm.

In a further improvement, the shielding dielectric layer is an oxide layer, and the thickness of the shielding dielectric layer is 0.8-1.2 μm.

In a further improvement, the second withstand voltage is greater than or equal to 100 V, the thickness of the first epitaxial layer is 8-18 μm, and the doping concentration of the first region of the first epitaxial layer is 2.0-3.5 $\Omega$*cm.

In a further improvement, the doping concentration of the second region is ½, ⅓, ⅕, or ¹⁄₁₀ of the doping concentration of the first region.

In a further improvement, the semiconductor substrate comprises a silicon substrate.

The first epitaxial layer comprises a silicon epitaxial layer.

The second epitaxial layer comprises a silicon epitaxial layer.

The material of the source conductive material layer comprises polysilicon.

Process structures of the gate trench and the terminal gate trench are identical.

Process structures of the terminal source conductive material layer and the source conductive material layer are identical.

In order to solve the above technical problem, in the method for manufacturing the semi-SGT MOSFET device provided by the present application, the first region and the second region are formed by the following steps:

forming the first epitaxial layer on the semiconductor substrate according to the doping concentration of the second region;

defining a formation region of the first region by means of lithography, and opening the first region; and performing ion implantation of the first conductivity type, and performing doping in the first region to increase the doping concentration of the first region to a desired value.

In a further improvement, the semiconductor substrate forms a wafer; and the diameter of the wafer is more than 8 or 12 inches.

In order to solve the above technical problem, in the method for manufacturing the semi-SGT MOSFET device provided by the present application, the first region and the second region are formed by the following steps:

forming the first epitaxial layer on the semiconductor substrate according to the doping concentration of the first region;

defining a formation region of the second region by means of lithography, and opening the second region; and performing ion implantation of the second conductivity type, and performing counter doping in the second region to decrease the doping concentration of the second region to a desired value.

In a further improvement, the semiconductor substrate forms a wafer; and the diameter of the wafer is more than 8 or 12 inches.

In the present application, the first epitaxial layer with a doping concentration lower than that of the second epitaxial layer is disposed at the bottom of the second epitaxial layer having the side surface covered by the source conductive material layer; due to the feature that the first epitaxial layer with a lower doping concentration can withstand a vertical withstand voltage, the withstand voltage requirement of the semi-SGT MOSFET device is achieved. Moreover, in order to overcome the problem of a decrease in the withstand voltage of the terminal region, which results from weak depletion of the second epitaxial layer due to the limited number of terminal source conductive material layers in the terminal region, the doping concentrations of the first epitaxial layer in the active region and the terminal region are configured individually, and the doping concentration of the second region of the first epitaxial layer in the terminal region is lower than the doping concentration of the first region of the first epitaxial layer in the active region. In this case, the first epitaxial layer in the terminal region can be easily depleted, thereby increasing the withstand voltage of the terminal region, so that the withstand voltage of the semi-SGT MOSFET device in the terminal region is higher than the withstand voltage in the active region. In this way, even if a breakdown occurs, the breakdown occurs in the active region, and a breakdown current can be easily led out, thereby improving the performance of the device.

Furthermore, since the terminal region is provided with no source region and therefore is non-conductive, the second region is related to only the withstand voltage of the device and is independent of the on-resistance of the device. Therefore, the reduction in the doping concentration of the second region can realize the improvement of the withstand voltage of the device without affecting the on-resistance of the device, that is, the performance of the device cell in the active region is not affected in the present application.

In addition, in the present application, the improvement of the withstand voltage of the terminal region requires only a reduction in the doping concentration of the second region, and requires no complicated setting for the terminal structure. Therefore, the present application also has the characteristic of simple processes.

BRIEF DESCRIPTION OF THE DRAWINGS

The present application is described below in detail with reference to the drawings and specific embodiments.

DETAILED DESCRIPTION OF THE DISCLOSURE

Figure 6:
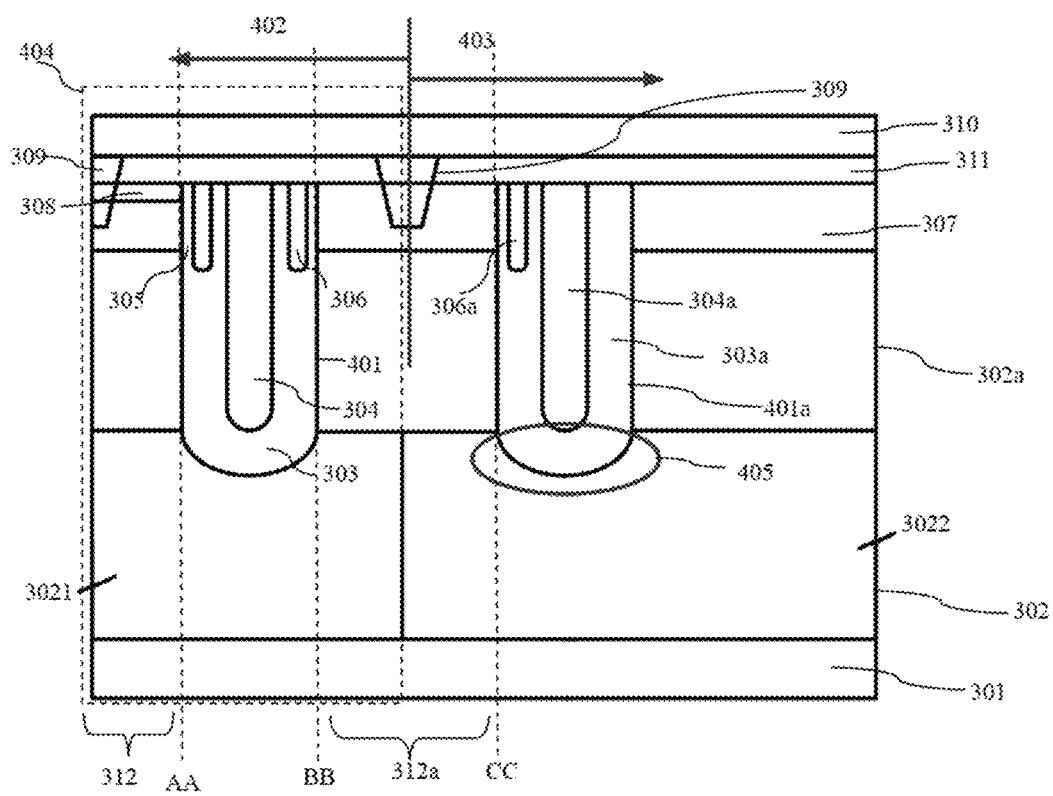
FIG. 6 is a schematic diagram of structures of an active region and a terminal region of a semi-SGT MOSFET device according to an embodiment of the present application.

FIG. 6 illustrates structures of an active region 402 and a terminal region 403 of a semi-SGT MOSFET device according to an embodiment of the present application. The semi-SGT MOSFET device in the embodiment of the present application includes:

a doped first epitaxial layer 302 of a first conductivity type formed on a semiconductor substrate 301, and a doped second epitaxial layer 302a of the first conductivity type formed on the surface of the first epitaxial layer 302.

The semi-SGT MOSFET device is divided into an active region 402 and a terminal region 403.

A plurality of device cells 404 of the semi-SGT MOSFET device are formed in the active region 402, and only one device cell 404 is shown in FIG. 6.

The device cell 404 includes a gate structure, the gate structure is formed in a gate trench 401, and a source conductive material layer 304 is formed in the gate trench 401. The gate trench 401 penetrates through the second epitaxial layer 302a.

In the active region 402, each gate trench 401 and a mesa region 312 between the gate trenches 401 form an alternate arrangement structure.

A terminal structure is provided in the terminal region 403, the terminal structure includes one or more terminal gate trenches 401a, the terminal gate trench 401a penetrates through the second epitaxial layer 302a, and a terminal source conductive material layer 304a is formed in the terminal gate trench 401a. In FIG. 6, the area between dashed line AA and dashed line BB is the formation area of a gate trench 401. The active region 402 has multiple gate trench 401, and the area between each gate trench 401 is a mesa region 312 in the active region 402. The dashed line CC represents the lateral position of the terminal gate trench 401a closest to the active region 402, and a mesa region between the dashed line BB and the dashed line CC is separately marked with a marker 312a.

The first epitaxial layer 302 is divided into a first region 3021 located in the active region 402 and a second region 3022 located in the terminal region 403, and doping concentrations of the first region 3021 and the second region 3022 are configured individually.

The doping concentration of the second epitaxial layer 302a is higher than the doping concentration of the first region 3021, and the higher doping concentration of the second epitaxial layer 302a can reduce the on-resistance of the device. In addition, the second epitaxial layer 302a can be laterally depleted by the source conductive material layer 304, so the voltage withstand capability of the second epitaxial layer 302a can be maintained.

The doping concentration of the second region 3022 is lower than the doping concentration of the first region 3021, so that the second region 3022 can be fully depleted when the device is reversely biased, thereby increasing the withstand voltage of the terminal region 403.

Figure 1:
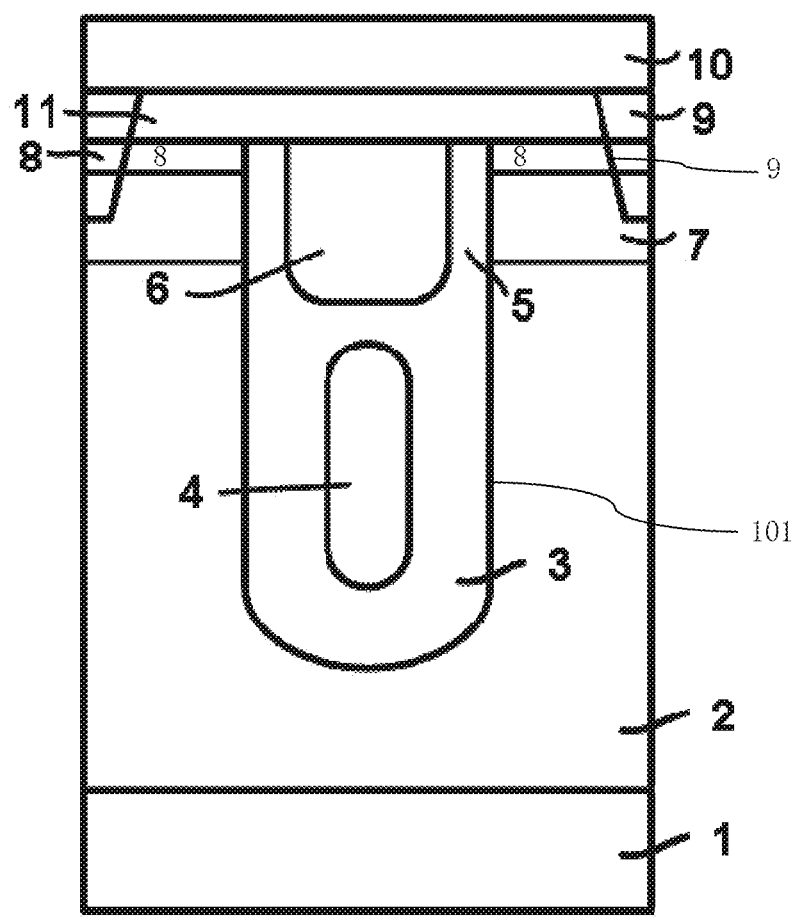
FIG. 1 is a schematic diagram of a device cell structure of a first existing SGT MOSFET device.
Figure 2:
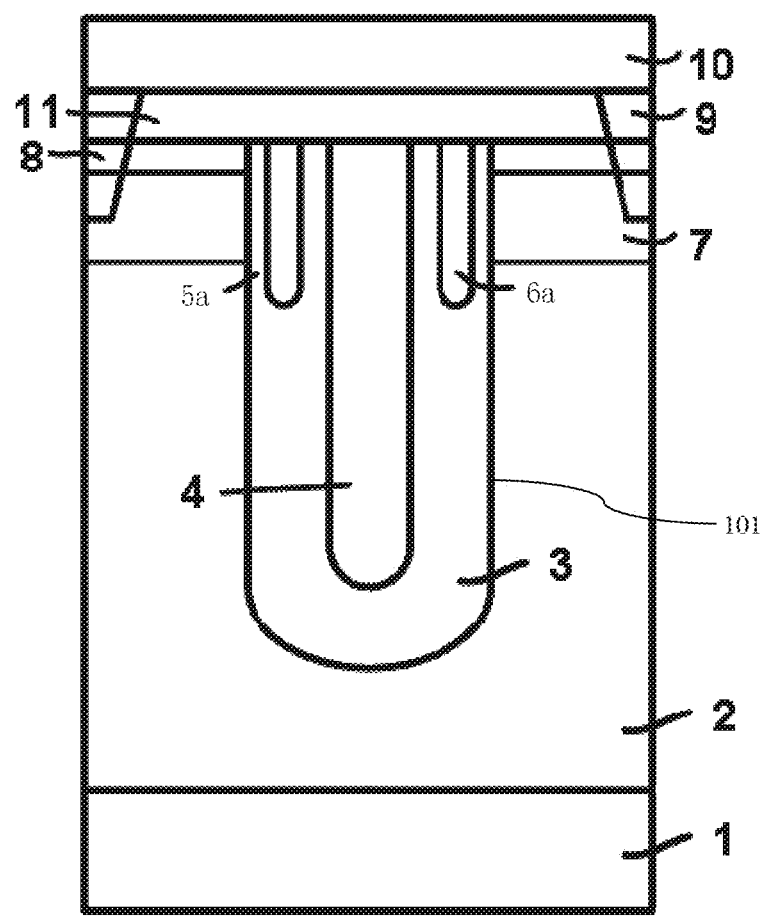
FIG. 2 is a schematic diagram of a device cell structure of a second existing SGT MOSFET device.
Figure 3:
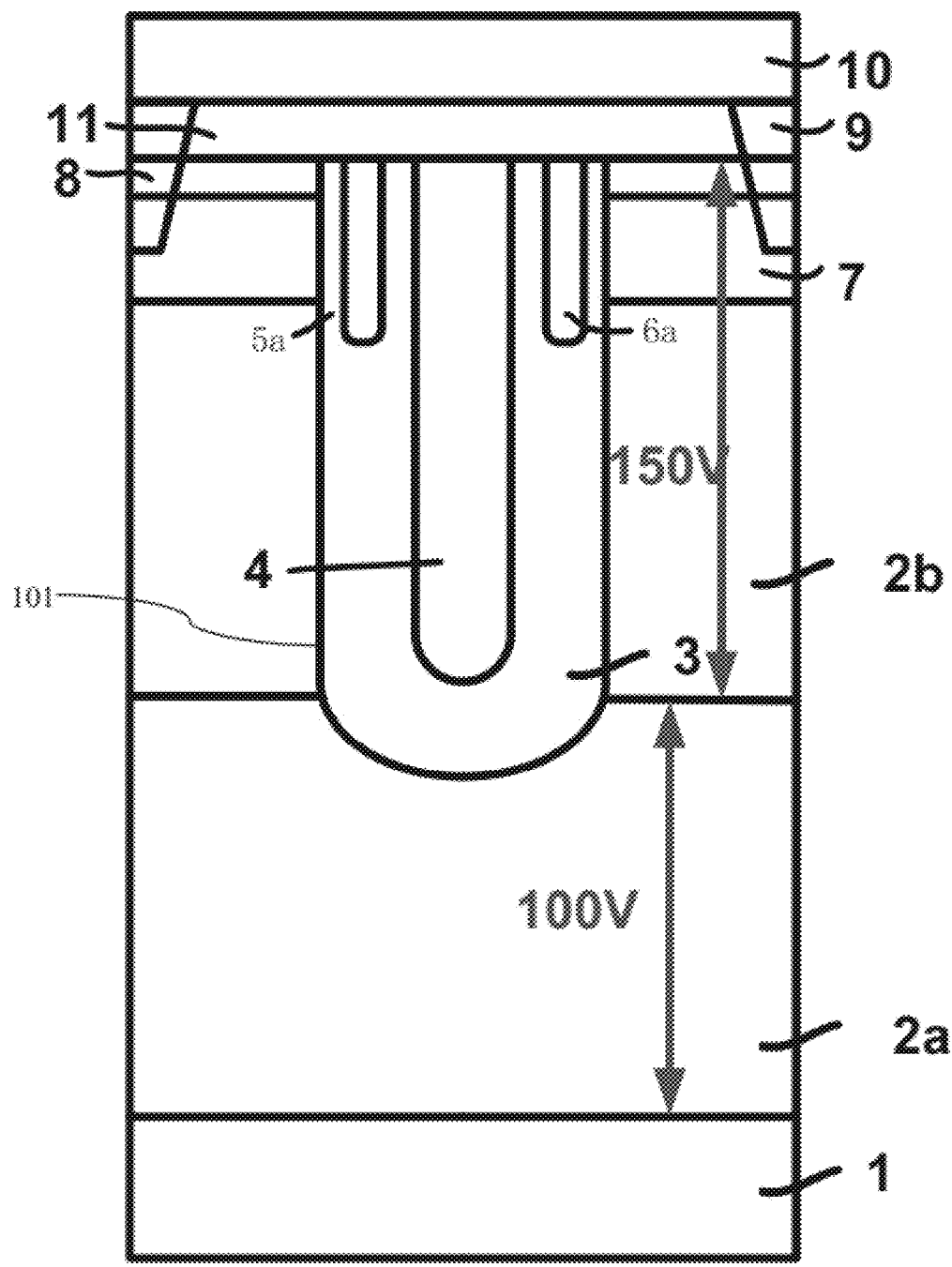
FIG. 3 is a schematic diagram of a device cell structure of an existing semi-SGT MOSFET device.
Figure 4A:
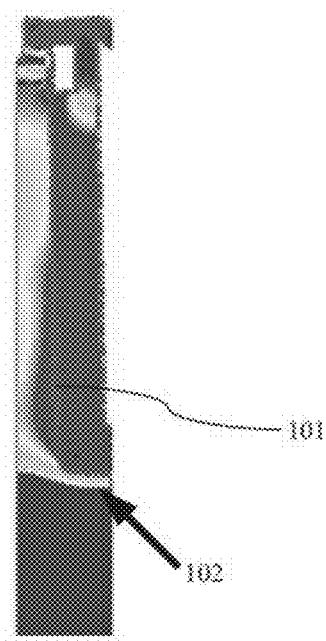
FIG. 4A illustrates the distribution of electric field intensity in a body region in breakdown of the device cell structure of the second existing SGT MOSFET device corresponding to FIG. 2.
Figure 4B:
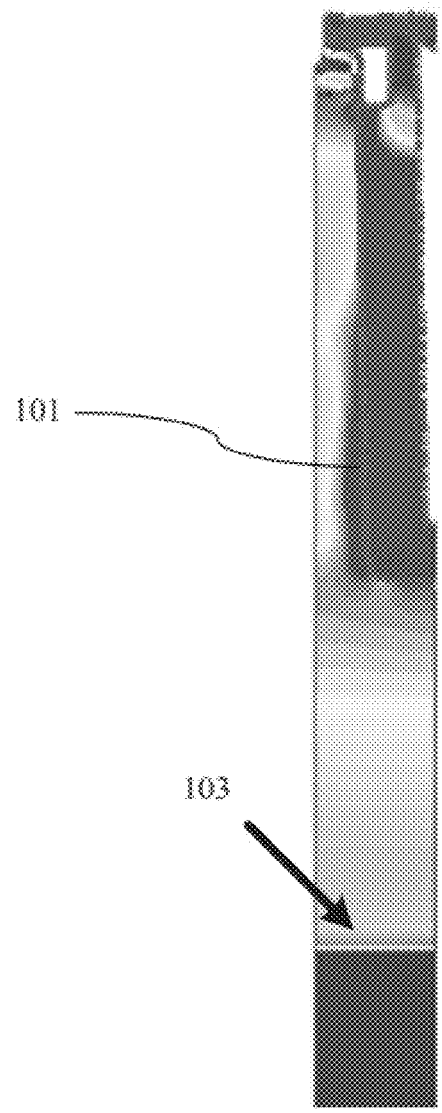
FIG. 4B illustrates the distribution of electric field intensity in the body region in breakdown of the device cell structure of the existing semi-SGT MOSFET device corresponding to FIG. 3.
Figure 5:
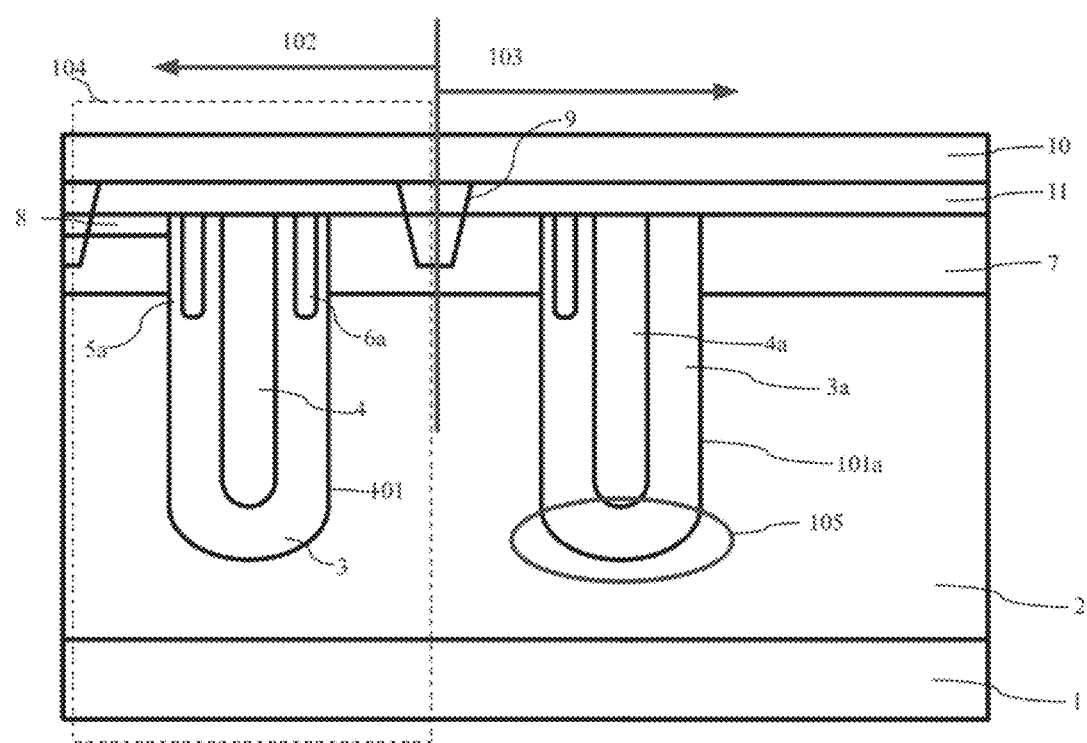
FIG. 5 is a schematic diagram of a structure of an active region and a terminal region of the second existing SGT MOSFET device.

In the active region 402, when the device is reversely biased, each source conductive material layer 304 has a lateral depletion effect on the second epitaxial layer 302a in the mesa region 312, the terminal source conductive material layer 304a has a lateral depletion effect on the second epitaxial layer 302a in the terminal region 403, the lateral depletion effect of the terminal source conductive material layer 304a on the second epitaxial layer 302a in the terminal region 403 is weaker than the lateral depletion effect of each source conductive material layer 304 on the second epitaxial layer 302a in the mesa region 312, and a reduction in the doping concentration of the second region 3022 compensates for the weakening of the lateral depletion effect of the terminal source conductive material layer 304a on the second epitaxial layer 302a in the terminal region 403. Compared with the electric field intensity in a bottom region of a gate trench 101a corresponding to the circle 105 in FIG. 5 and the expansion of the first epitaxial layer 2, the electric field intensity in a bottom region of the gate trench 401a corresponding to the circle 405 in FIG. 6 of the embodiment of the present application is reduced, and the second region 3022 is fully expanded, i.e., fully depleted, thereby finally increasing the breakdown voltage of the device.

In the active region 402, when the device is reversely biased, the second epitaxial layer 302a has a first withstand voltage, the first epitaxial layer 302 has a second withstand voltage due to longitudinal depletion, and the withstand voltage of the semi-SGT MOSFET device in the active region 402 is the sum of the first withstand voltage and the second withstand voltage.

The second epitaxial layer 302a in the terminal region 403 has a third withstand voltage, the second region 3022 has a fourth withstand voltage due to longitudinal depletion, and the withstand voltage of the semi-SGT MOSFET device in the terminal region 403 is the sum of the third withstand voltage and the fourth withstand voltage.

The doping concentration of the second region 3022 is reduced to increase the fourth withstand voltage, so that the withstand voltage of the semi-SGT MOSFET device in the terminal region 403 is greater than or equal to the withstand voltage in the active region 402.

In the embodiment of the present application, the doping concentration of the second region 3022 is ½, ⅓, ⅕, or 1/10 of the doping concentration of the first region 3021.

In the embodiment of the present application, in the active region 402, the gate structure further includes:

a gate conductive material layer 306, the gate conductive material layer 306 spaced from a corresponding side surface of the gate trench 401 by a gate dielectric layer 305.

The source conductive material layer 304 is spaced from a corresponding inner side surface of the gate trench 401 by a shielding dielectric layer 303.

The gate conductive material layer 306 is isolated from the source conductive material layer 304 by a conductive material interlayer dielectric layer.

The gate structure is a left-right structure, and the gate conductive material layer 306 is located on both sides of a top region of the source conductive material layer 304. In other embodiments, the gate structure is a top-bottom structure, and the gate conductive material layer 306 is located directly above the source conductive material layer 304.

In the terminal region 403, a terminal gate conductive material layer 306a is formed in the terminal gate trench 401a or no terminal gate conductive material layer 306a is formed.

In the active region 402, each device cell 404 further includes:

A channel region formed by a doped well region 307 of a second conductivity type.

A heavily doped source region 308 of the first conductivity type is formed on the surface of the channel region.

A drift region is formed by the second epitaxial layer 302a and the first epitaxial layer 302 at the bottom of the channel region.

A heavily doped drain region of the second conductivity type is formed on the backside of the semiconductor substrate 301.

The source region 308 is connected to a source formed by a front side metal layer 310 by means of a via 309 on the top. The via 309 penetrates through an interlayer film 311.

The source conductive material layer 304 is also connected to the source by means of the corresponding via 309 on the top.

The gate conductive material layer 306 is connected to a gate formed by the front side metal layer 310 by means of the corresponding via on the top.

A backside metal layer is formed on the backside of the drain region, and a drain is formed by the backside metal layer.

In the active region 402, the gate conductive material layer 306 penetrates through the channel region and covers a side surface of the channel region.

The source conductive material layer 304 covers a side surface of the second epitaxial layer 302a at the bottom of the channel region. When the gate trench 401 becomes deeper, the longitudinal length of the side surface of the second epitaxial layer 302a covered by the source conductive material layer 304 becomes longer, and the first withstand voltage becomes higher; when the shielding dielectric layer 303 becomes thicker, the first withstand voltage becomes higher; and when the gate trench 401 becomes deeper and the shielding dielectric layer 303 becomes thicker, the stress of the semiconductor substrate 301 becomes larger. The first withstand voltage is less than or equal to a maximum value defined by the stress of the semiconductor substrate 301.

The terminal region 403 further includes:

the well region 307 that forms the channel region in the active region 402.

No source region 308 is formed on the surface of the well region 307.

The terminal region shares both the drift region and the drain region with the active region 402.

The terminal source conductive material layer 304a is also connected to the source by means of the corresponding via 309 on the top.

The semiconductor substrate 301 includes a silicon substrate.

The first epitaxial layer 302 includes a silicon epitaxial layer.

The second epitaxial layer 302a includes a silicon epitaxial layer.

The material of the source conductive material layer 304 includes polysilicon. The material of the gate conductive material layer 306 includes polysilicon.

Process structures of the gate trench 401 and the terminal gate trench 401a are identical.

Process structures of the terminal source conductive material layer 304a and the source conductive material layer 304 are identical.

Process structures of the terminal gate conductive material layer 306a and the gate conductive material layer 306 are identical.

The material of the gate dielectric layer 305 is an oxide layer, and process conditions of the terminal gate dielectric layer are the same as those of the gate dielectric layer 305.

The material of the shielding dielectric layer 303 is an oxide layer, and process conditions of the terminal shielding dielectric layer 303a are the same as those of the shielding dielectric layer 303.

The first embodiment of the present application is described below in combination with specific parameters used in a 250 V semi-SGT MOSFET.

The maximum value of the first withstand voltage is less than or equal to 150 V.

The thickness of the second epitaxial layer 302a at the bottom of the channel region is 7-11 µm.

The resistivity of the second epitaxial layer 302a is 0.3-0.6 Ω*cm.

The shielding dielectric layer 303 is an oxide layer, and the thickness of the shielding dielectric layer 303 is 0.8-1.2 µm.

The second withstand voltage is greater than or equal to 100 V, and the thickness of the first epitaxial layer 302 is 8-18 µm. The resistivity of the first region 3021 of the first epitaxial layer 302 is 2.0-3.5 Ω*cm, resistivity can be converted into doping concentration.

In the embodiment of the present application, the semi-SGT MOSFET device is an N-type device, the first conductivity type is N-type, and the second conductivity type is P-type. Alternatively, the semi-SGT MOSFET device is a P-type device, the first conductivity type is P-type, and the second conductivity type is N-type.

In the present application, the first epitaxial layer 302 with a doping concentration lower than that of the second epitaxial layer 302a is disposed at the bottom of the second epitaxial layer 302a having the side surface covered by the source conductive material layer 304; due to the feature that the first epitaxial layer 302 with a lower doping concentration can withstand a vertical withstand voltage, the withstand voltage requirement of the semi-SGT MOSFET device is achieved. Moreover, in order to overcome the problem of a decrease in the withstand voltage of the terminal region 403, which results from weak depletion of the second epitaxial layer 302a due to the limited number of terminal source conductive material layers 304a in the terminal region 304, the doping concentrations of the first epitaxial layer 302 in the active region 402 and the terminal region 403 are configured individually, and the doping concentration of the second region 3022 of the first epitaxial layer 302 in the terminal region 403 is lower than the doping concentration of the first region 3021 of the first epitaxial layer 302 in the active region 402. In this case, the first epitaxial layer 302 in the terminal region 403 can be easily depleted, thereby increasing the withstand voltage of the terminal region 403, so that the withstand voltage of the semi-SGT MOSFET device in the terminal region 403 is higher than the withstand voltage in the active region 402. In this way, even if a breakdown occurs, the breakdown occurs in the active region 402, and a breakdown current can be easily led out, thereby improving the performance of the device.

Furthermore, since the terminal region 403 is provided with no source region 308 and therefore is non-conductive, the second region 3022 is related to only the withstand voltage of the device and is independent of the on-resistance of the device. Therefore, the reduction in the doping concentration of the second region 3022 can realize the improvement of the withstand voltage of the device without affecting the on-resistance of the device, that is, the performance of the device cell 404 in the active region 402 is not affected in the present application.

Figure 7A:
FIG. 7A and FIG. 7B are structural schematic diagrams in steps of forming a first region and a second region of a first epitaxial layer in a method for manufacturing the semi-SGT MOSFET device according to a first embodiment of the present application.
Figure 7B:
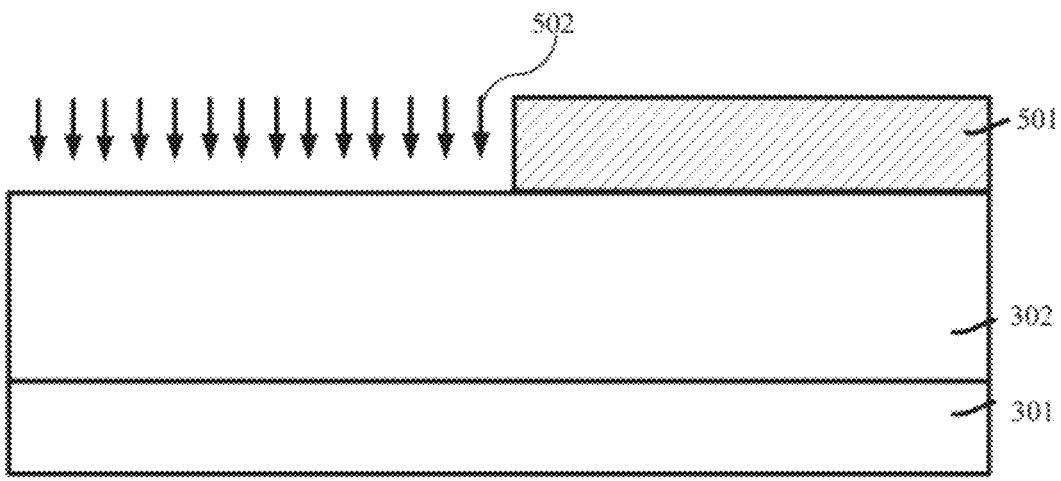

FIG. 7A and FIG. 7B are structural schematic diagrams in steps of forming a first region and a second region of a first epitaxial layer in a method for manufacturing the semi-SGT MOSFET device according to the first embodiment of the present application.

In the method for manufacturing the semi-SGT MOSFET device according to the first embodiment of the present application, the first region 3021 and the second region 3022 are formed by the following steps:

Referring to FIG. 7A, the first epitaxial layer 302 is formed on the semiconductor substrate 301 according to the doping concentration of the second region 3022. The semiconductor substrate 301 forms a wafer; and the diameter of the wafer is more than 8 or 12 inches. In the method of the first embodiment of the present application, after the structure of the embodiment of the present application shown in FIG. 6 is formed, the depth of the gate trench 301 and the thickness of the shielding dielectric layer 303 can be reduced, and a higher withstand voltage can be achieved, thereby reducing the stress of the wafer. Therefore, the method is applicable to a manufacturing process of large-sized wafers.

The semiconductor substrate 301 is doped with a high concentration of the first conductivity type. For a 250V semi-SGT, the resistivity corresponding to the first epitaxial layer 302 in FIG. 7A may be 15 Ω*cm, which is much higher than the resistivity required for withstanding a voltage of 100 V.

Referring to FIG. 7B, a photoresist pattern 501 is formed by means of lithography to define a formation region of the first region 3021, and the first region 3021 is opened.

Ion implantation of the first conductivity type as indicated by the mark 502 is performed, and doping is performed in the first region 3021 to increase the doping concentration of the first region 3021 to a desired value.

The ion implantation 502 of the first conductivity type may be a single time of high-energy implantation with energy such as 2 MeV and phosphorus implantation with a dosage of 2e11 cm3-2e12 cm3; or may be multiple times of implantation with different energies, wherein the distribution of the doping concentration in the drift region 2a is as uniform as possible.

After ion implantation 502 of the first conductivity type is completed, high temperature annealing can be performed to make the distribution more uniform. The annealing process can also be shared by a subsequent thermal process of the SGT.

Figure 8A:
FIG. 8A and FIG. 8B are structural schematic diagrams in steps of forming a first region and a second region of a first epitaxial layer in a method for manufacturing the semi-SGT MOSFET device according to a second embodiment of the present application.
Figure 8B:
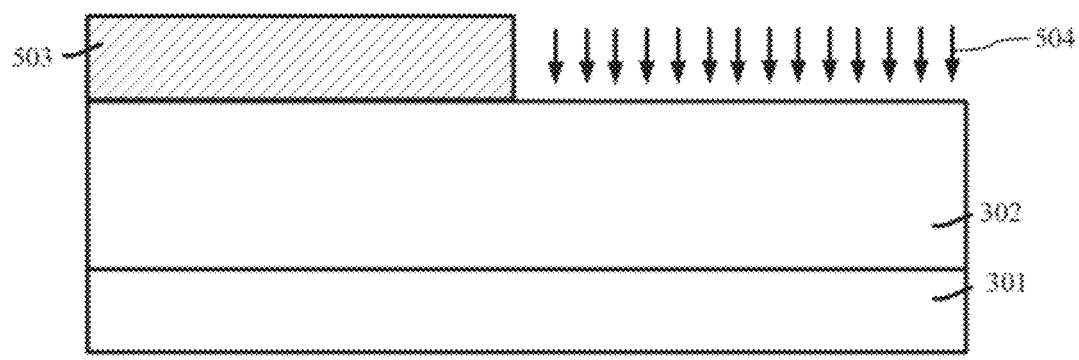

FIG. 8A and FIG. 8B are structural schematic diagrams in steps of forming a first region and a second region of a first epitaxial layer in a method for manufacturing the semi-SGT MOSFET device according to a second embodiment of the present application. In the second embodiment of the present application, the first region 3021 and the second region 3022 are formed by the following steps:

Referring to FIG. 8A, the first epitaxial layer 302 is formed on the semiconductor substrate 301 according to the doping concentration of the first region 3021. The semiconductor substrate 301 forms a wafer; and the diameter of the wafer is more than 8 or 12 inches. In the method of the second embodiment of the present application, after the structure of the embodiment of the present application shown in FIG. 6 is formed, the depth of the gate trench 301 and the thickness of the shielding dielectric layer 303 can be reduced, and a higher withstand voltage can be achieved, thereby reducing the stress of the wafer. Therefore, the method is applicable to a manufacturing process of large-sized wafers.

Referring to FIG. 8B, a photoresist pattern 503 is formed by means of lithography to define a formation region of the second region 3022, and the second region 3022 is opened.

Ion implantation of the second conductivity type as indicated by the mark 504 is performed, and doping is performed in the second region 3022 to increase the doping concentration of the second region 3022 to a desired value.

The present application is described above in detail via specific embodiments, but these embodiments are not intended to limit the present application. Without departing from the principle of the present application, those skilled in the art can make many modifications and improvements, which shall also be regarded as the protection scope of the present application.

What is claimed is:

1. A semi-SGT MOSFET device, comprising:
a first epitaxial layer doped with a first conductivity type formed on a semiconductor substrate, and a second epitaxial layer doped with the first conductivity type formed on a surface of the first epitaxial layer; wherein the semi-SGT MOSFET device is divided into an active region and a terminal region;
a plurality of device cells of the semi-SGT MOSFET device are formed in the active region, each of the plurality of device cells comprises a gate structure, the gate structure is formed in a gate trench, and a source conductive material layer is formed in the gate trench; the gate trench penetrates through the second epitaxial layer;
in the active region, each gate trench and a mesa region between the gate trenches form an alternate arrangement structure;
a terminal structure is provided in the terminal region, the terminal structure comprises one or more terminal gate trenches, the terminal gate trench penetrates through the second epitaxial layer, and a terminal source conductive material layer is formed in the one or more terminal gate trenches;
the first epitaxial layer is divided into a first region located in the active region and a second region located in the terminal region, and doping concentrations of the first region and the second region are configured individually; and
a doping concentration of the second epitaxial layer is higher than the doping concentration of the first region, and a doping concentration of the second region is lower than the doping concentration of the first region, so that the second region can be fully depleted when the semi-SGT MOSFET device is reversely biased, thereby increasing a withstand voltage of the terminal region.

2. The semi-SGT MOSFET device according to claim 1, wherein in the active region, when the semi-SGT MOSFET device is reversely biased, each source conductive material layer has a lateral depletion effect on the second epitaxial layer in the mesa region, the terminal source conductive material layer has a lateral depletion effect on the second epitaxial layer in the terminal region, the lateral depletion effect of the terminal source conductive material layer on the second epitaxial layer in the terminal region is weaker than the lateral depletion effect of each source conductive material layer on the second epitaxial layer in the mesa region, and a reduction in the doping concentration of the second region compensates for a weakening of the lateral depletion effect of the terminal source conductive material layer on the second epitaxial layer in the terminal region.

3. The semi-SGT MOSFET device according to claim 2, wherein in the active region, when the semi-SGT MOSFET device is reversely biased, the second epitaxial layer has a first withstand voltage, the first epitaxial layer has a second withstand voltage due to longitudinal depletion, and the withstand voltage of the semi-SGT MOSFET device in the active region is a sum of the first withstand voltage and the second withstand voltage;
the second epitaxial layer in the terminal region has a third withstand voltage, the second region has a fourth withstand voltage due to longitudinal depletion, and the withstand voltage of the semi-SGT MOSFET device in the terminal region is a sum of the third withstand voltage and the fourth withstand voltage; and
the doping concentration of the second region is reduced to increase the fourth withstand voltage, so that the withstand voltage of the semi-SGT MOSFET device in the terminal region is greater than or equal to the withstand voltage in the active region.

4. The semi-SGT MOSFET device according to claim 3, wherein in the active region, the gate structure further comprises:
a gate conductive material layer, the gate conductive material layer is spaced from a corresponding side surface of the gate trench by a gate dielectric layer;
the source conductive material layer is spaced from a corresponding inner side surface of the gate trench by a shielding dielectric layer;
the gate conductive material layer is isolated from the source conductive material layer by a conductive material interlayer dielectric layer; and
the gate structure is a top-bottom structure, and the gate conductive material layer is located directly above the source conductive material layer; or
the gate structure is a left-right structure, and the gate conductive material layer is located on both sides of a top region of the source conductive material layer.

5. The semi-SGT MOSFET device according to claim 4, wherein in the terminal region, a terminal gate conductive material layer is formed in the terminal gate trench or no terminal gate conductive material layer is formed.

6. The semi-SGT MOSFET device according to claim 4, wherein in the active region, each device cell further comprises:
a channel region formed by a doped well region of a second conductivity type;
a heavily doped source region of the first conductivity type is formed on a surface of the channel region;
a drift region is formed by the second epitaxial layer and the first epitaxial layer at the bottom of the channel region;
a heavily doped drain region of the second conductivity type is formed on a backside of the semiconductor substrate;
the heavily doped source region is connected to a source formed by a front side metal layer by means of a via on the top;
the source conductive material layer is also connected to the source by means of the corresponding via on the top;
the gate conductive material layer is connected to a gate formed by the front side metal layer by means of the corresponding via on the top; and
a backside metal layer is formed on a backside of the heavily doped drain region, and a drain is formed by the backside metal layer.

7. The semi-SGT MOSFET device according to claim 6, wherein in the active region, the gate conductive material layer penetrates through the channel region and covers a side surface of the channel region;

the source conductive material layer covers a side surface of the second epitaxial layer at the bottom of the channel region; when the gate trench becomes deeper, a longitudinal length of the side surface of the second epitaxial layer covered by the source conductive material layer becomes longer, and the first withstand voltage becomes higher; when the shielding dielectric layer becomes thicker, the first withstand voltage becomes higher; when the gate trench becomes deeper and the shielding dielectric layer becomes thicker, a stress of the semiconductor substrate becomes larger; and the first withstand voltage is less than or equal to a maximum value defined by the stress of the semiconductor substrate.

8. The semi-SGT MOSFET device according to claim 6, wherein the terminal region further comprises:

the doped well region that forms the channel region in the active region;

no source region is formed on the surface of the doped well region;

the terminal region shares both the drift region and the heavily doped drain region with the active region; and the terminal source conductive material layer is also connected to the source by means of the corresponding via on the top.

9. The semi-SGT MOSFET device according to claim 7, wherein a maximum value of the first withstand voltage is less than or equal to 150 V;

a thickness of the second epitaxial layer at the bottom of the channel region is 7-11 μm; and a resistivity of the second epitaxial layer is 0.3-0.6 Ω*cm.

10. The semi-SGT MOSFET device according to claim 9, wherein the shielding dielectric layer is an oxide layer, and a thickness of the shielding dielectric layer is 0.8-1.2 μm.

11. The semi-SGT MOSFET device according to claim 9, wherein the second withstand voltage is greater than or equal to 100 V, a thickness of the first epitaxial layer is 8-18 μm, and a resistivity of the first region of the first epitaxial layer is 2.0-3.5 Ω*cm.

12. The semi-SGT MOSFET device according to claim 1, wherein the doping concentration of the second region is ½, ⅓, ⅕, or ⅒ of the doping concentration of the first region.

13. The semi-SGT MOSFET device according to claim 1, wherein the semiconductor substrate comprises a silicon substrate;

the first epitaxial layer comprises a silicon epitaxial layer;

the second epitaxial layer comprises a silicon epitaxial layer;

a material of the source conductive material layer comprises polysilicon;

process structures of the gate trench and the terminal gate trench are identical; and process structures of the terminal source conductive material layer and the source conductive material layer are identical.

14. A method for manufacturing the semi-SGT MOSFET device according to claim 1, wherein the first region and the second region are formed by the following steps:

forming the first epitaxial layer on the semiconductor substrate according to the doping concentration of the second region;

defining a formation region of the first region by means of lithography, and opening the first region; and performing ion implantation of the first conductivity type, and performing doping in the first region to increase the doping concentration of the first region to a desired value.

15. The method for manufacturing the semi-SGT MOSFET device according to claim 14, wherein the semiconductor substrate forms a wafer; and the diameter of the wafer is more than 8 or 12 inches.

16. A method for manufacturing the semi-SGT MOSFET device according to claim 1, wherein the first region and the second region are formed by the following steps:

forming the first epitaxial layer on the semiconductor substrate according to the doping concentration of the first region;

defining a formation region of the second region by means of lithography, and opening the second region; and performing ion implantation of a second conductivity type, and performing counter doping in the second region to decrease the doping concentration of the second region to a desired value.

17. The method for manufacturing the semi-SGT MOSFET device according to claim 16, wherein the semiconductor substrate forms a wafer; and the diameter of the wafer is more than 8 or 12 inches.

* * * * *